United States Patent [19]

Chang et al.

[11] 4,179,534

[45] Dec. 18, 1979

[54] GOLD-TIN-GOLD OHMIC CONTACT TO N-TYPE GROUP III-V SEMICONDUCTORS

[75] Inventors: Chuan C. Chang, Berkeley Heights; Felix Ermanis, Summit; Robert J. McCoy, Chatham; Shohei Nakahara, North Plainfield; Tan T. Sheng, Millington, all of N.J.

[73] Assignee: Bell Telephone Laboratories, Incorporated, Murray Hill, N.J.

[21] Appl. No.: 909,024

[22] Filed: May 24, 1978

[51] Int. Cl.$^2$ .................................... H01L 23/48
[52] U.S. Cl. ................................ 427/89; 29/590; 357/17; 357/67; 357/71; 427/85; 427/87; 427/90; 427/91; 427/383 D
[58] Field of Search .......... 427/89, 90, 383 R, 383 D, 427/85, 87, 91; 357/67, 71, 17; 29/589, 590

[56] References Cited

U.S. PATENT DOCUMENTS

| 3,636,618 | 1/1972 | Herzog et al. | 357/67 |
| 3,850,688 | 11/1974 | Halt | 427/89 |
| 3,890,699 | 6/1975 | Vilms | 29/590 |
| 3,942,243 | 3/1976 | Murray | 357/71 |
| 3,959,522 | 5/1976 | Ladany et al. | 427/89 |
| 4,011,583 | 3/1977 | Levinstein et al. | 357/71 |
| 4,081,824 | 3/1978 | Keramidas | 357/67 |

OTHER PUBLICATIONS

Paola, "Metallic Contacts for Gallium Arsenide", Solid-State Electronics, vol. 13, pp. 1189-1197 (1970).
Rideout, "A Review of the Theory and Technology for Ohmic Contacts to Group III-V Compound Semiconductors", Solid-State Electronics, vol. 18, pp. 541-550 (1975).
Buene et al., "Alloying Behavior of Au-In and Au-Sn Films on Semiconductors", Thin Solids Films, vol. 34, pp. 149-152 (1976).
Shih et al., "Contact Resistances of Au-Ge-Ni, Au-Zn and Al to III-V Compounds", SSE vol. 15, No. II-A, pp. 1177-1180, 1972.

*Primary Examiner*—John D. Smith
*Attorney, Agent, or Firm*—Allen N. Friedman; Richard D. Laumann

[57] ABSTRACT

A semiconductor device with a low resistance ohmic contact, strongly adherent to the n-type surface of a body (11) of Group III-V compound semiconductor is obtained by a process including the sequential deposition of gold (13), tin (14) and gold (15) at a surface temperature of less than 200 degrees C followed by a heat treatment in a nonoxidizing atmosphere. This process has shown particular advantage when applied to aluminum containing compound semiconductors (e.g., gallium aluminum arsenide). For such use an initial deposition of aluminum (16) has proven particularly successful in producing consistently low resistance ohmic contacts. The invention has been used in the production of light emitting diodes.

9 Claims, 3 Drawing Figures

GOLD-TIN-GOLD OHMIC CONTACT TO N-TYPE GROUP III-V SEMICONDUCTORS

TECHNICAL FIELD

The invention is in the field of semiconductor device processing and the devices made thereby. In particular the invention relates to providing external electrical contact to compound semiconductors.

BACKGROUND OF THE INVENTION

The production of ohmic contacts to semiconductors is of constant concern in semiconductor device manufacture. The contacting of compound semiconductors has proven particularly difficult, perhaps, because of the more complex chemistry of these materials relative to elemental semiconductors. A survey of representative technology in this area appears in *Solid State Electronics*, 18 (1975) 541. The contacting procedures typically involve the provision of two types of constituents. The first is a dopant for the semiconductor and the second is a metal for providing external contact. N-type dopants for Group III-V semiconductors include tin and germanium. A widely used contacting metal is gold. The use of such gold-tin and gold-germanium contacts requires considerable care to avoid the balling up of these constituents on the semiconductor surface and other types of nonuniformity (U.S. Pat. No. 3,890,699, issued June 24, 1975, see, for example, Column 1, lines 13-17). This reference teaches the sequential deposition of layers of germanium, silver, and gold. In another prior art method (U.S. Pat. No. 3,959,522 issued May 25, 1976) gold is first deposited on a heated substrate, the substrate is cooled, a layer of tin is deposited on the cooled substrate, the device is reheated, then cooled again to receive deposits of nickel and gold for external contact. In a multilayer process developed for contacting p-type materials zinc is used as a p-type dopant. However, zinc is known to have a high vapor pressure. In an effort to suppress the evaporation of zinc during the heat treatment step needed to diffuse the zinc into the semiconductor, a method involving the sequential deposition of a layer of gold followed by a layer of a gold-zinc alloy and a second layer of gold was developed. (U.S. Pat. No. 3,850,688 issued Nov. 26, 1974).

Of the Group III-V semiconductors those containing aluminum (e.g., gallium aluminum arsenide) have posed a particular contacting problem. It is believed that the presence of aluminum compounds in the surface tends to make these contacts electrically unreliable. A method developed to counteract this problem is disclosed in U.S. Pat. No. 4,081,824, issued Mar. 28, 1978. This method involves the deposition of a transition layer of aluminum and the dopant element followed by a layer of gold. This method has proven useful in manufacture in providing a high yield of electrically reliable contacts. However in exemplary manufacturing runs a significant number of contacts experienced mechanical failure after wires were bonded to the deposited contact pads. When the wires were stressed a significant number of contacts separated at the interface between the semiconductor and deposited contact material. Investigation of these devices by electron microscopy showed the presence of voids in the interface. The presence of these voids is believed to be responsible for the bonding failures. It is postulated that these voids are produced by the diffusion of tin during and after gold deposition but prior to heat treatment. The provision of a contact which is electrically and mechanically reliable has been of constant concern.

SUMMARY OF THE INVENTION

An electrically and mechanically reliable ohmic contact to n-type Group III-V compound semiconductors has been invented and is taught below. The process which provides these high peel strength contacts includes the sequential deposition of layers of gold, tin and then gold at least the first two of which take place while the temperature of the semiconductor surface is below 200 degrees C. The semiconductor body with the applied multi-layer contact structure is then heated in a nonoxidizing atmosphere to a temperature from 350 degrees C. to 500 degrees C. in order to diffuse the tin into the semiconductor. When wires were bonded to these contacts with standard wire bonding techniques in exemplary test runs, it was observed that to a great degree the wire broke before the contact material peeled from the surface. This process has proven to be of particular advantage when used to contact aluminum containing compound semiconductors, which are known to be difficult to contact. In exemplary embodiments, an initial deposition of a layer of aluminum was used to improve the electrical reliability of the contacts. This method has been used in the production of light emitting diodes.

DETAILED DESCRIPTION

Figure 1:
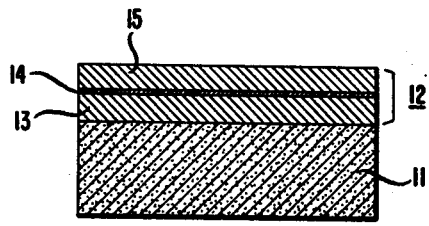
FIG. 1 is an elevational view in section of an exemplary semiconductor wafer with a three layer contact.

The production of compound semiconductor devices with electrically and mechanically reliable contacts has been a problem that has occupied many workers and has resulted in extensive technical and patent literature. The technique embodied in FIG. 1 has provided electrically and mechanically reliable ohmic contact to n-type Group III-V semiconductors. It is well recognized that the term "ohmic" signifies that any nonlinearities are acceptably small with respect to the desired operation of the semiconductor device. In this process the semiconductor body 11 forms the substrate for the subsequent deposition of contact layers 12. From the point of view of the ohmic contact the critical portion of the semiconductor body 11 is the first micrometer of semiconductor material at the surface which is at least 95 mole percent of Group III-V compound semiconductor. Also included may be the various dopant elements required for operation of the semiconductor device. The semiconductor may be a massive body as illustrated or, for example, a crystalline portion on the surface of a nonsemiconductor body. The Group III-V portion may also be epitaxially deposited on a semiconductor body of different composition.

The contact formation process includes the deposition of tin as an n-type dopant and gold as the contact metal. The process includes the sequential deposition of a layer of gold 13 followed by a deposition of a layer of tin 14 and the deposition of the second layer of gold 15. The first layer of gold 13 serves to separate the tin layer 14 from the surface while permitting sufficient tin to diffuse to the surface to produce the high doping levels required for ohmic contact. The first gold layer 13 should be at least 0.1 micrometers thick in order to provide sufficient separation of the tin layer 14 from the semiconductor body 11. This separation prevents the formation of voids at the semiconductor surface when the tin diffuses into the gold. The deposition of this layer 13 takes place on a cool substrate (less than 200 degrees C.) in order to enhance the uniformity of the deposit and prevents the formation of unwanted compounds on the surface of the semiconductor 11. After the first gold deposition a layer of tin 14 is deposited. The amount of tin deposited should be at least 0.2 mole percent of the total gold content of layers 13 and 15. This tin content is required to provide sufficient concentration of tin in the gold to provide the doping necessary in the semiconductor to produce ohmic contact. If lower resistance contacts are desired, for example, for higher current devices, a tin content of at least 1 mole percent should be deposited. The total content of tin should be less than 5 mole percent so as not to cause mechanical problems in the subsequent layers. The tin layer is also deposited at less than 200 degrees C. for uniformity. Over the tin layer 14 a second gold layer 15 is deposited to bring the total thickness of layer 12 up to that thickness required for wire bonding procedures (at least two micrometers is preferred). The formation of voids, if any, between the layers of gold 13, 15 has been shown not to have a noticeable effect on the peel strength of the contact. These three depositions are followed by a heat treatment in the temperature range of 350 degrees C. to 500 degrees C. in order to diffuse tin into the surface of the semiconductor 11. The tin has been shown to diffuse rapidly through the gold at relatively low temperatures. It is believed that most of the tin has already diffused into the gold by the time the second gold deposition has been completed. The heat treatment step should include a residence time of at least 0.5 minutes in the desired temperature range but preferably from 1 to 2 minutes. This heat treatment takes place in an atmosphere which is sufficiently nonoxidizing to avoid deleterious formation of oxides. The inclusion of a quantity of a reducing species (e.g., hydrogen) helps to remove any oxides which may form.

Figure 2:
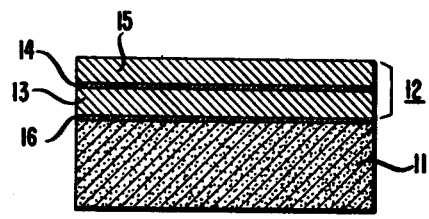
FIG. 2 is an elevational view in section of an exemplary aluminum containing semiconductor wafer with a contact including an initial layer of aluminum.

This deposition procedure is particularly useful in contacting aluminum containing Group III-V compound semiconductors. Such materials include aluminum phosphide, aluminum arsenide, gallium aluminum arsenide, gallium aluminum phosphide, gallium aluminum antimonide and indium aluminum arsenide. These materials are known to be difficult to contact particularly when the aluminum content is at least 10 mole percent of the Group III constituents. FIG. 2 shows an exemplary contact to a semiconductor body 11 of an aluminum containing material. This contact may include an initial deposition of a sufficient aluminum to produce layer 16 at least 0.002 micrometers thick. At the end of the aluminum deposition the actual layer thickness may be less due, for example, to gettering by the aluminum of surface oxides.

Figure 3:
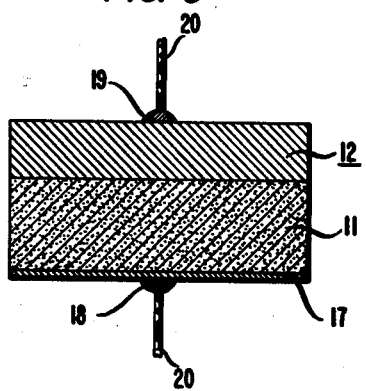
FIG. 3 is an elevational view in section of an exemplary diode.

FIG. 3 shows a completed device after the diffusion step and after the bonding of wires 20 to the n-side contact layer 12 and the p-side contact layer 17.

EXAMPLE

Light emitting diodes of gallium aluminum arsenide have been produced by a method including the deposition of approximately 0.0035 micrometers of aluminum, approximately 0.2 micrometers of gold, sufficient tin to produce a layer approximately 0.05 micrometers thick (the actual layer thickness may be less because of diffusion) and approximately 2.8 micrometers of gold on the n-type surface of a GaAlAs wafer. During these depositions the substrate temperature was less than 200 degrees C. After the depositions the wafers were placed in a nonoxidizing atmosphere of 15 percent $H_2$, 85 percent $N_2$ and heat treated for from one to two minutes at approximately 415 degrees C. Contact to the p-side of the devices was made by depositions of 800 Angstroms of one percent beryllium in gold, followed by 2100 Angstroms gold followed by heat treatment similar to that above. In exemplary production runs yields of at least 90 percent of devices with less than $10^{-3}$ ohms contact resistance were observed with sufficient mechanical reliability to withstand ultrasonic wire bonding and subsequent device handling. The technique has proven to be a commercially viable manufacturing procedure.

We claim:

1. Method for making a semiconductor device comprising making contact to a semiconductor portion at least one micrometer thick, which said portion includes at least 95 mole percent of Group III-V compound semiconductor, which method comprises (a) depositing a contacting layer of metal on the surface of the semiconductor portion and (b) heat treating the semiconductor portion in a nonoxidizing atmosphere CHARACTERIZED IN THAT the depositing includes the sequential deposition of gold, tin and gold, the first gold deposition and the tin deposition taking place while the body is at a temperature of less than 200 degrees C. and the first gold deposition deposits a layer at least 0.1 micrometers thick and the heat treating step includes a residence time of at least one-half minute in the temperature range from 350 degrees C. to 500 degrees C.

2. A method of claim 1 in which the molar ratio of tin to gold in the contacting layer is from 0.2 to 5 mole percent.

3. A method of claim 1 in which the portion is an epitaxially deposited layer.

4. A method of claim 1 in which the semiconductor includes aluminum as at least 10 mole percent of its Group III constituents.

5. A method of claim 4 in which the depositing step includes the initial deposition of aluminum, sufficient to produce a 20 Angstrom layer.

6. A method of claim 1 in which the total thickness of gold in the first and second gold depositions is at least 2 micrometers thick.

7. A method of claim 1 in which the heat treating includes a residence time from 0.5 to 2 minutes in the temperature range from 350 to 500 degrees C.

8. A method of claim 7 in which the deposition includes sequentially depositing approximately 0.2 micrometers of gold, approximately 0.05 micrometers of tin and approximately 2.8 micrometers of gold.

9. A method of claim 1 including a further step of applying an external contact to the gold layer.

* * * * *